United States Patent
Ou et al.

(10) Patent No.: US 6,900,648 B2
(45) Date of Patent: May 31, 2005

(54) TESTER FOR PRINTED CIRCUIT BOARDS

(75) Inventors: Chun-Na Ou, Tu-Chen (TW); Lin Yan, Shenzhen (CN); Yue Qing Zhao, Shenzhen (CN); Tai Ping Zhou, Shenzhen (CN); Ga Lei Hu, Shenzhen (CN); Hua Dong, Shenzhen (CN)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/636,341

(22) Filed: Aug. 6, 2003

(65) Prior Publication Data

US 2004/0178815 A1 Sep. 16, 2004

(51) Int. Cl.[7] ............................ G01R 11/04; G01R 11/50
(52) U.S. Cl. ........................ 324/755; 324/758; 324/765
(58) Field of Search ................................ 324/750, 754, 324/758, 765

(56) References Cited

U.S. PATENT DOCUMENTS

| | | | | | |
|---|---|---|---|---|---|
| 5,055,779 | A | * | 10/1991 | Kerschner et al. | 324/754 |
| 5,408,189 | A | * | 4/1995 | Swart et al. | 324/758 |
| 5,572,144 | A | * | 11/1996 | Davidson et al. | 324/755 |
| 5,894,225 | A | * | 4/1999 | Coffin | 324/762 |
| 6,496,025 | B1 | * | 12/2002 | Stadelmayer et al. | 324/761 |

* cited by examiner

Primary Examiner—Michael Tokar
Assistant Examiner—Emily Y Chan
(74) Attorney, Agent, or Firm—Wei Te Chung (57) ABSTRACT

A tester includes a base (10) including a top wall (12) and a control panel (18), a cover (30) pivotably attached to the base, a pair of master cylinders (40) connecting the base with the cover, a holding fixture including a lower unit (50) and an upper unit (70), and a first testing unit. A plurality of first positioning members (54) is formed on the lower unit for supporting a printed circuit board assembly including a printed circuit board (PCB) (80). A plurality of pressing post (76) depends from the upper unit for pressing the PCB, and a plurality of support posts (127) is formed on the top wall for extension through the lower unit to support the PCB. The control panel controls the master cylinders to open and close the cover, and controls the first testing unit to adjustably insert in ports of the PCB for test.

18 Claims, 6 Drawing Sheets

TESTER FOR PRINTED CIRCUIT BOARDS

BACKGROUND OF THE INVENTION

1. Field of the Invention

The present invention relates to testing machines, and more particularly to testers for testing printed circuit boards.

2. Description of the Related Art

Automatic testing machines have generally been found to be effective for use in testing printed circuit boards of various types. Such testing machines are particularly useful when testing large quantities of identical printed circuit boards, such as computer motherboards.

A typical tester used for testing printed circuit boards comprises a cover and a base. A control panel is formed on a front wall of the base. A retaining device, such as a fixture, is provided on a top wall of the base, for retaining a printed circuit board to be tested. The cover is parallelepiped-shaped, and is pivotably attached to the base. A knob is formed on a front wall of the cover, for opening and closing the cover. When testing a printed circuit board, an operator has to lift open the cover with the knob, fix the printed circuit board on the retaining device, and close the cover to start the test. However, such manual operation is slow, laborious and inefficient.

It is important for a tester to be able to accurately position a printed circuit board relative to a plurality of testing devices within the tester. Taiwan Patent Publication No. 483655 discloses a printed circuit board fixture comprising a base and a plurality of positioning pins. Each positioning pin comprises a pair of small ends and a large shaft between the small ends. The base defines a plurality of holes therein, and bottom ends of the positioning pins are inserted in the holes of the base respectively. The printed circuit board defines a plurality of positioning holes therein. Top ends of the positioning pins extend through the positioning holes of the printed circuit board. The printed circuit board is thereby supported on the shafts of the positioning pins.

The above testers incorporating typical printed circuit board fixtures are suitable for conventional motherboards that consist of a printed circuit board and a plurality of electrical components mounted thereon. However, many recently developed motherboards have highly complicated circuitry patterns and numerous electrical components mounted thereon. This requires the motherboard to be mechanically strong enough to hold the components securely. Therefore, a reinforcing plate is mounted to a solder side of the motherboard. The reinforcing plate functions only as a strengthening device. Therefore, the reinforcing plate is generally manufactured and installed with relatively low precision, to reduce manufacturing costs and save time.

However, this imprecision gives rise to a problem in the testing procedure. Because the reinforcing plate is not precisely mounted, it is frequently not parallel to the motherboard. The testing devices in the typical tester have predetermined positions relative to the conventional motherboard, not to the new type of motherboard having the reinforcing plate. As a result, it is problematic to position the new type of motherboard relative to the testing devices.

Thus the typical tester is not suitable for the new types of motherboard. When testing components such as I/O ports and sockets on the new type of motherboard, an operator has to manually attach or detach testing devices to or from the motherboard. Such manual operation is slow, laborious and inefficient. Furthermore, the motherboard is liable to be inadvertently damaged when handled by the operator.

SUMMARY OF THE INVENTION

Accordingly, an object of the present invention is to provide a tester which reduces manual labor and increases efficiency.

Another object of the present invention is to provide a tester which can test motherboards having reinforcing plates.

To achieve the above objects, a tester in accordance with the present invention comprises a base, a cover pivotably attached to the base, a pair of master cylinders, a holding fixture, a first testing unit and a second testing unit. The tester is for testing a printed circuit board assembly comprising a printed circuit board and a reinforcing plate mounted below the printed circuit board. The printed circuit board comprises a plurality of I/O ports mounted on a rear side thereof, and a plurality of positioning holes defined in one side portion thereof, and the reinforcing plate defines a plurality of openings therein. The base comprises a top wall and a control panel, a plurality of support posts are formed on the top wall. The master cylinders are pivotably attached to the base and the cover respectively, and controlled by the control panel to open and close the cover. The holding fixture comprises an upper unit and a lower unit, the upper unit is movably received in the cover, and the lower unit is adjustably supported on the top wall. The lower unit comprises four first positioning members for supporting four corners of the reinforcing plate respectively, and a plurality of through holes defined in the lower unit aligned with the openings of the reinforcing plate for extension of the support posts to support the printed circuit board. The upper unit comprises a plurality of positioning pins depending from the upper unit for engaging in the positioning holes of the printed circuit board, and a plurality of pressing post formed at the upper unit for pressing the printed circuit board. The first testing unit is arranged at a rear of the top wall, and comprises a pair of actuators controlled by the control panel, a connecting board attached between the actuators, and at least one adjustable board, and a plurality of probes mounted to the adjustable board. A plurality of bolts and coil springs adjustably connects the adjustable board to the connecting board. In operation, the printed circuit board assembly is held in place between the upper and lower units of the holding fixture, the control panel then controls the actuators of the first testing unit for insertion of the probes into the I/O ports of the printed circuit board, thereby the printed circuit board is ready for test. In an alternative embodiment, the support posts are removed from the top wall, the tester is thus suitable for testing a printed circuit board without the reinforcing plate.

Other objects, advantages and novel features of the present invention will be drawn from the following detailed description of preferred embodiments of the present invention with the attached drawings, in which:

DESCRIPTION OF THE PREFERRED EMBODIMENTS

Referring to FIGS. 1 to 4, a tester in accordance with the preferred embodiment of the present invention is for testing a printed circuit board assembly. The tester comprises a base 10, a cover 30, a pair of master cylinders 40, a pair of slave cylinders 45, a holding fixture, a first testing unit 20 and a second testing unit 60.

The base 10 comprises a top wall 12 and a control panel 18. The control panel 18 is arranged at a front wall of the base 10, and is for receiving and sending signals. Three aligned and spaced lower hooks 14 are upwardly formed at a front portion of the top wall 12. Each lower hook 14 is L-shaped, and comprises a vertical part and a horizontal part. A first sensor 14a is mounted on the vertical part under the horizontal part of a middle one of the lower hooks 14. The first sensor 14a sends signals to the control panel 18. A pair of actuators 16 is respectively positioned behind the two lower hooks 14 that are at opposite sides of the middle lower hook 14. Each actuator 16 comprises a slidable shaft 161 extending through a middle part thereof. A pair of holes 141 is defined in the two side lower hooks 14 respectively, corresponding to the shafts 161 of the actuators 16. The actuators 16 receive controlling signals sent out from the control panel 18, and they can push the shafts 161 through the respective holes 141. A pair of pivot pedestals 121 is upwardly formed at each of opposite side edge portions of the top wall 12. Two aligned and spaced rear pivot pedestals 123 are upwardly formed near a rear edge of the top wall 12, and are pivotally attached to the cover 30. Referring particularly to FIG. 4, a plurality of spring pins 125 projects from a central area of the top wall 12. A plurality of support posts 127 extends upwardly from the top wall 12 adjacent the spring pins 125. The top wall 12 defines four holes (not shown) at four corners of the central area respectively. A pair of projections 129 extends upwardly from the top wall 12 at diagonally opposite corners of the central area respectively. Each projection 129 defines a guiding hole 129a therein.

Figure 1:
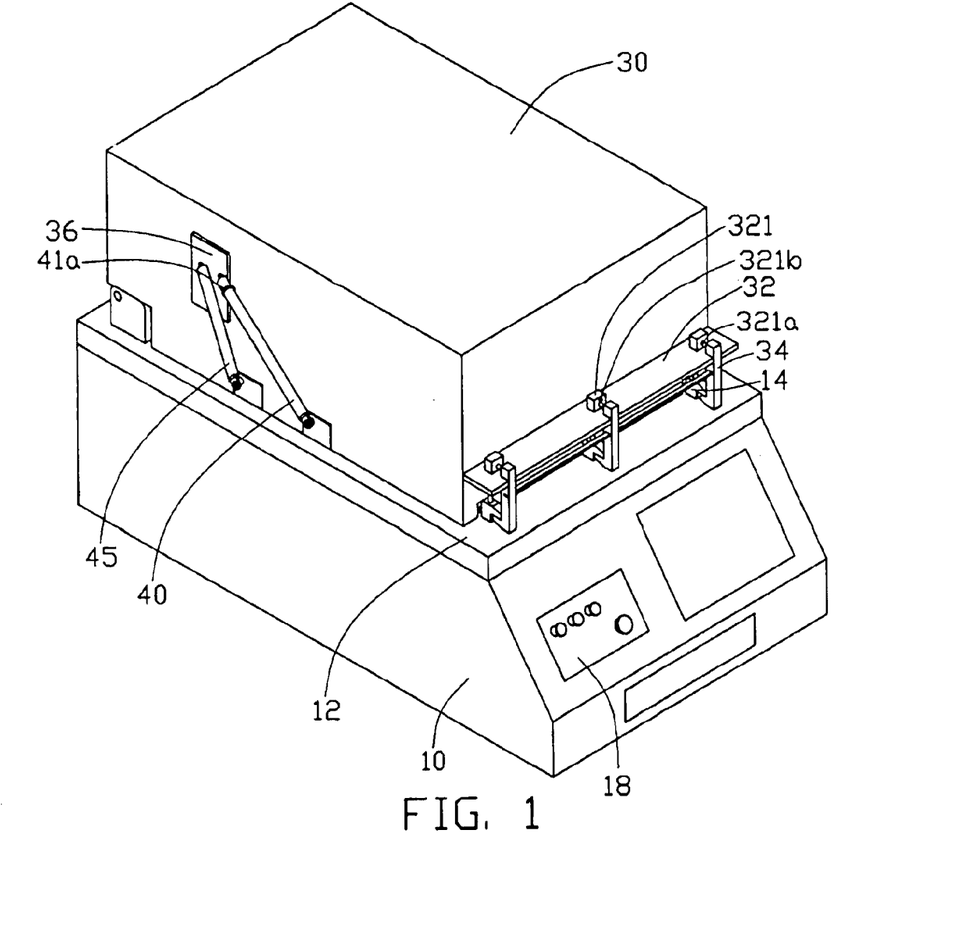
FIG. 1 is an isometric view of a tester in accordance with a preferred embodiment of the present invention, showing the tester in a closed position.
Figure 2:
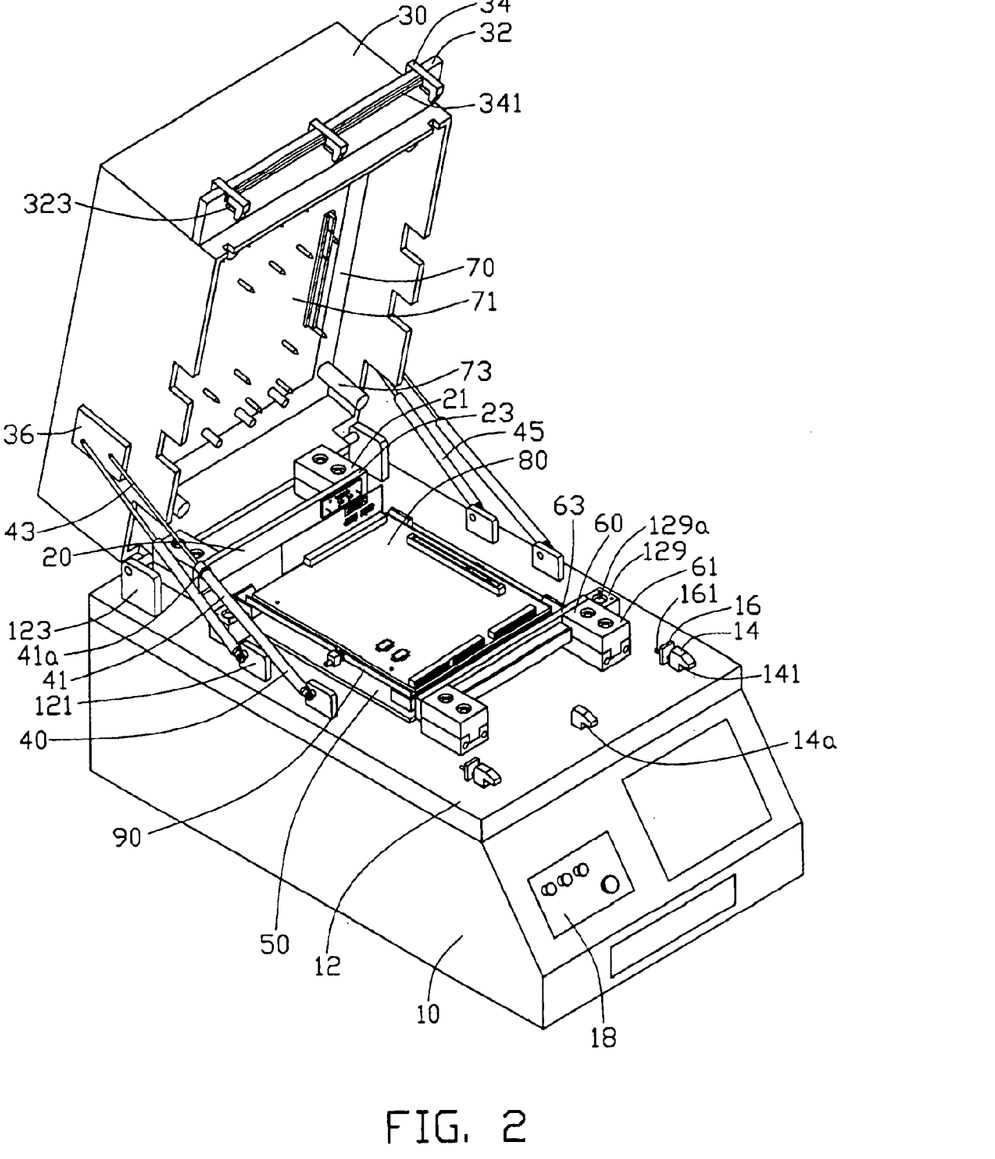
FIG. 2 is similar to FIG. 1, but showing a printed circuit board assembly positioned in the tester, which is in an open position.

The cover 30 is generally parallelepiped-shaped, and is pivotally attached to the rear pivot pedestals 123. A horizontal beam 32 is formed on a front face of the cover 30. Three spaced blocks 321 protrude upwardly from the beam 32. A spring pin 321a protrudes forwardly from each block 321. A second sensor 321b is mounted on a middle one of the blocks 321 over a middle one of the spring pins 321a. The second sensor 321b sends signals to the control panel 18. Three spaced posts 323 depend from the beam 32. The posts 323 contact the horizontal parts respectively of the lower hooks 14, for supporting the cover 30 when the cover 30 is in a closed position. Three upper hooks 34 are pivotally attached in the beam 32, corresponding to the three lower hooks 14. Each upper hook 34 is L-shaped, and comprises a horizontal part and vertical part. The upper hooks 34 contact the spring pins 321a respectively. A connecting bar 341 connects between the upper hooks 34 below the beam 32. A pair of pivot pedestals 36 is formed on opposite side faces of the cover 30 respectively, corresponding to the pairs of pivot pedestals 121 of the base 10.

The master cylinders 40 are electrically controlled by the control panel 18. Each master cylinder 40 comprises a cylinder casing 41 and a piston rod 43. A medium such as gas or oil is pumped into the cylinder casing 41, for pushing the piston rod 43 along the cylinder casing 41. One end of each master cylinder 40 is pivotably fixed to a corresponding pivot pedestal 36 of the cover 30, and an opposite end of each master cylinder 40 is pivotably fixed to a corresponding forward one of the pivot pedestals 121 of the base 10. The piston rods 43 are movable in the respective cylinder casings 41. A third sensor 41a is mounted at a predetermined position on an outer surface of one of the cylinder casings 41, and a fourth sensor (not shown) is mounted on the corresponding piston rod 43. When said piston rod 43 reaches the predetermined position in said cylinder casing 41, the third sensor 41a is activated by the fourth sensor, and the third sensor 41a sends a signal to the control panel 18. Each slave cylinder 45 is pivotably fixed to a corresponding pivot pedestal 36, and to a corresponding rearward one of the pivot pedestals 121. Each slave cylinder 45 comprises a cylinder casing (not labeled) and a piston rod (not labeled). The slave cylinders 45 are hermetically filled with compressed gas.

Figure 3:
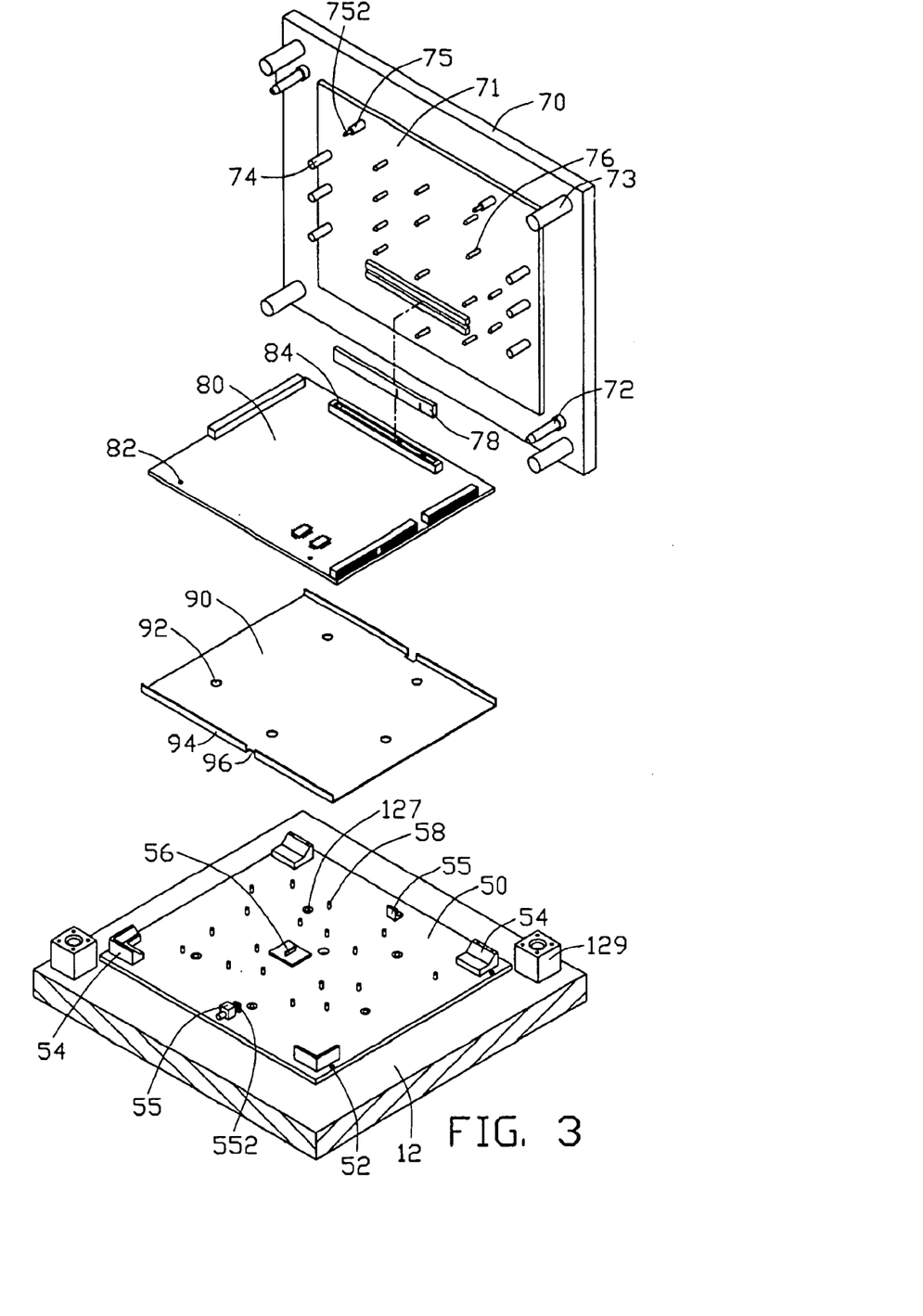
FIG. 3 is an exploded, isometric view of a holding fixture of the tester of FIG. 1, together with the printed circuit board assembly and part of a base of the tester.
Figure 4:
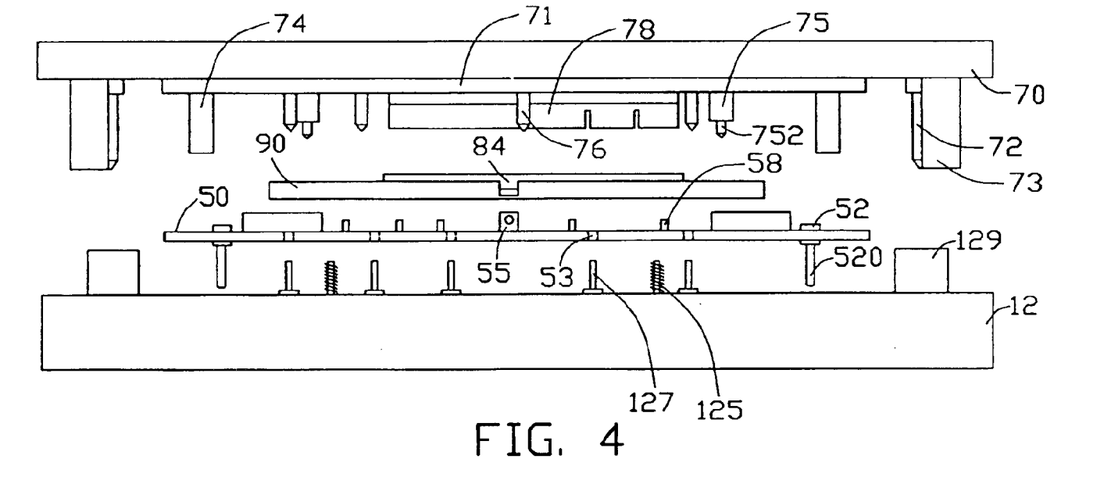
FIG. 4 is a side elevation view of the components of FIG. 3 partly assembled.

Referring to FIGS. 2 to 4, the printed circuit board assembly comprises a printed circuit board 80 and a reinforcing plate 90. The printed circuit board 80 defines a pair of spaced positioning holes 82 in one side portion thereof. The printed circuit board 80 comprises a socket 84 at an opposite side portion thereof, and a plurality of I/O ports mounted on a front and rear sides thereof.

The reinforcing plate 90 is mounted below but spaced a small distance from a solder side of the printed circuit board 80. A plurality of openings 92 is defined in the reinforcing plate 90, corresponding to the support posts 127 of the top wall 12. A pair of flanges 94 extends upwardly from opposite side edges of the reinforcing plate 94 respectively. A cutout 96 is defined in a middle of each flange 94.

The holding fixture is for holding the printed circuit board assembly in place. The holding fixture comprises a lower unit 50 and an upper unit 70. The lower unit 50 covers the central area of the top wall 12, and is adjustably supported on the spring pins 125 of the top wall 12. The upper unit 70 is accommodated in the cover 30. The upper unit 70 is attached to the cover 30 by a plurality of actuators such as cylinders (not shown). The actuators are electrically controlled by the control panel 18 to move toward or retract back from the lower unit 50.

The lower unit 50 comprises a rectangular board. Four guiding studs 52 are mounted to four corners of the board of the lower unit 50 respectively. Each guiding stud 52 comprises a shank portion 520 depending from the lower unit 50, for being received in the holes (not shown) of the central area of the top wall 12. When the lower unit 50 is moved downwardly, it overcomes resistance of the spring pins 125, the shank portions 520 of the guiding studs 52 moving in said holes of the top wall 12 respectively. Four first positioning members 54 are formed adjacent the guiding studs 52 respectively. Each first positioning member 54 comprises an inclined plane. At least one first positioning member 54 is generally L-shaped. A pair of opposing second positioning members 55 is formed on opposite sides of the board of the lower unit 50 respectively. A retractable small block 552 projects inwardly from one of the second positioning members 55. A position detector 56 is mounted on a middle of the board of the lower unit 50, for detecting whether the reinforcing plate 90 is disposed in a correct position. A plurality of through holes 53 is defined in the board of the lower unit 50, corresponding to the support posts 127 of the top wall 12 respectively. A plurality of protrusions 58 extends upwardly from the board of the lower unit 50, for supporting a bottom of the reinforcing plate 90 thereon.

The upper unit 70 comprises a base plate, and a test plate 71 attached to an underside of the base plate.

The base plate comprises a pair of guiding shafts 72, corresponding to the guiding holes 129a of the projections 129. Four pillars 73 depend from four corners of the base plate respectively. When the upper unit 70 is moved toward the lower unit 50, the pillars 73 contact the top wall 12 and stop further movement.

The test plate 71 comprises two rows of identical columns 74 depending from opposite front and rear sides thereof respectively. A pair of spaced positioning pins 75 depends from one side portion of the test plate 71. Each positioning pin 75 comprises a spring loaded head portion 752. A fifth sensor (not shown) is provided at a top of each positioning pin 75, so that when the head portion 752 retracts into the positioning pin 75 and contacts the fifth sensor, the fifth sensor sends a signal to the control panel 18. A plurality of spaced pressing posts 76 protrudes downwardly from a central area of the test plate 71, for pressing the printed circuit board 80. A test card 78 is attached to the test plate 71, corresponding to the socket 84 of the printed circuit board 80.

The first and second testing units 20, 60 are for testing I/O ports of rear and front sides of the printed circuit board 80 respectively. The first testing unit 20 is mounted on the top wall 12 between the rear pivot pedestals 123, at a rear of the lower unit 50. The second testing unit 60 is mounted on the top wall 12 at a front of the lower unit 50.

Figure 6:
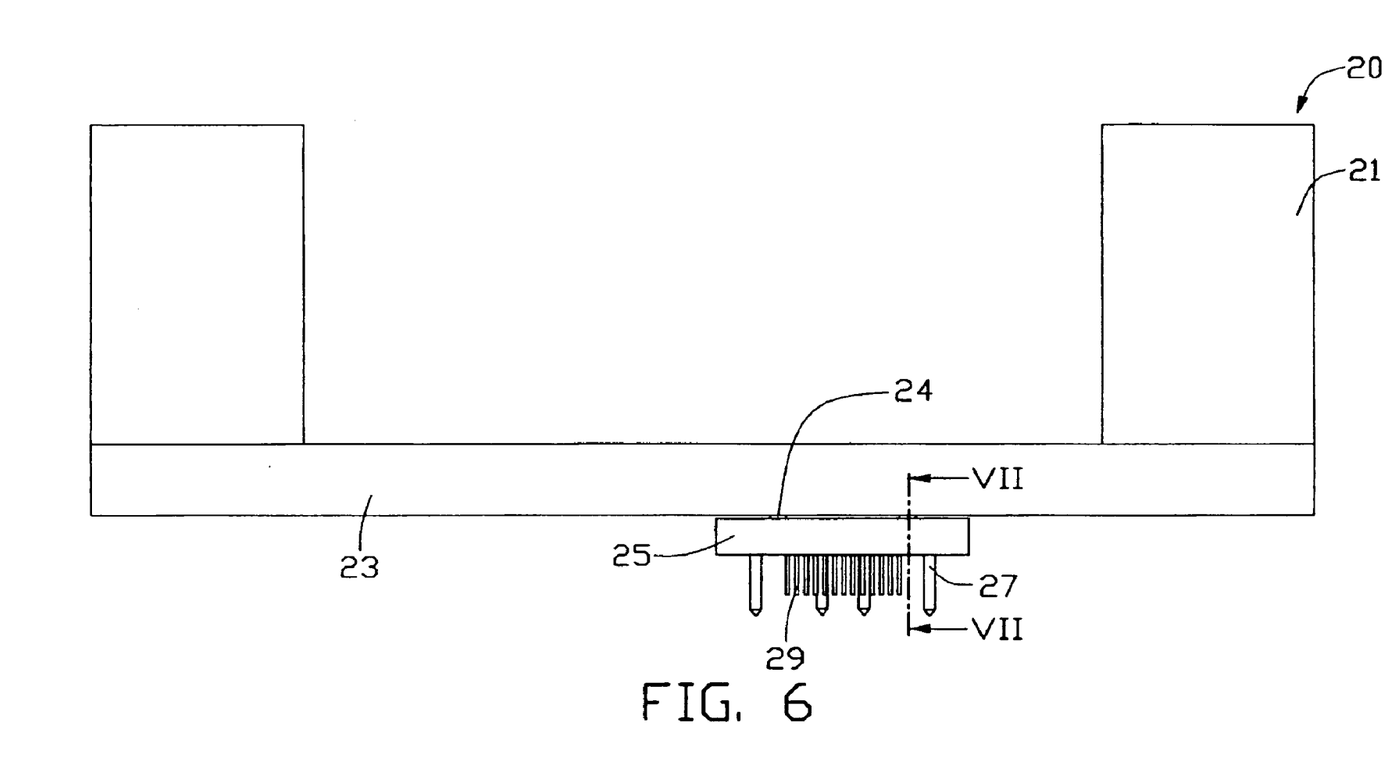
FIG. 6 is an enlarged, top plan view of a first testing unit of the tester of FIG. 1.

Referring particularly to FIG. 6, the first testing unit 20 comprises a pair of spaced actuators 21, a connecting board 23 attached between the actuators 21, at least one adjustable board 25, and a plurality of adjustable positioning pins 27 and probes 29 mounted to the adjustable board 25. The actuators 21 can be gas cylinders or hydraulic cylinders, and are controlled by the control panel 18. The probes 29 are for testing I/O ports, such as USB ports and parallel ports, of a rear side of the printed circuit board 80.

Figure 7:
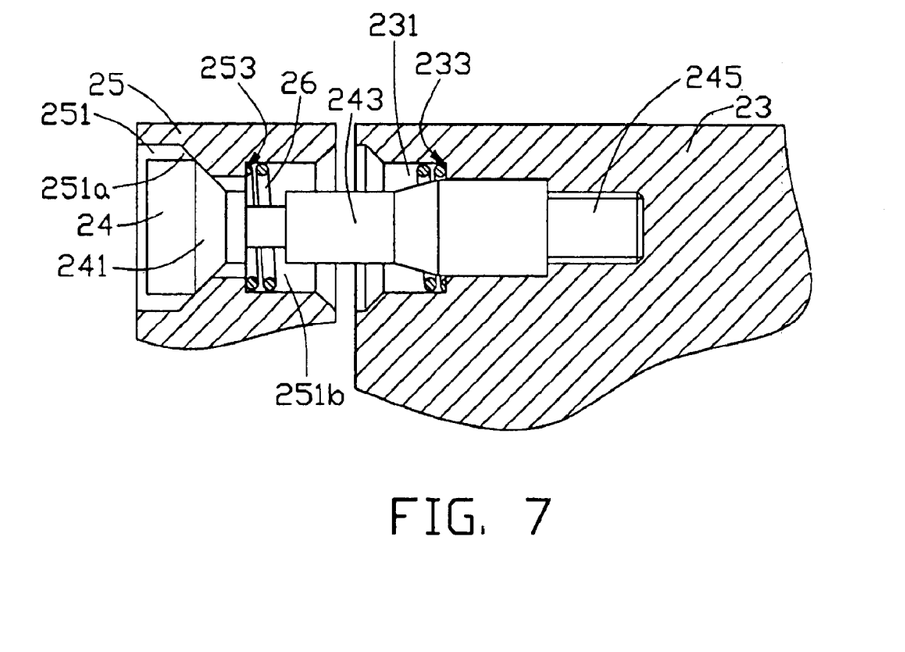
FIG. 7 is a schematic, cross-sectional view taken along line VII—VII of FIG. 6.

Referring also to FIG. 7, a plurality of bolts 24 and coil springs 26 connects the connecting board 23 to the adjustable board 25. The connecting board 23 defines a plurality of stepped holes 231 therein. Each stepped hole 231 defines a shoulder 233 therearound, and comprises a threaded end (not labeled). The adjustable board 25 defines a plurality of through holes 251 therein, corresponding to the stepped holes 231. Each through hole 251 comprises a tapered portion 251a and a shouldered portion 251b. The shouldered portion 251b defines a shoulder 253 therearound. Each bolt 24 comprises tapered head 241, a stepped rod 243, and a threaded end 245. A diameter of each part of the stepped rod 243 is less than that of corresponding parts of the stepped hole 231 and the shouldered portion 251b. A corresponding coil spring 26 is received between the shoulders 233, 253 respectively. The bolt 24 extends through the through hole 251, the coil spring 26, and into the stepped hole 231 respectively. The threaded end 245 of the bolt 24 is screwed into the threaded end of the connecting board 23 respectively. One part of the tapered head 241 of the bolt 24 fittingly engages with a tapered shoulder of the adjustable board 25 at the tapered portion 251a of the through hole 251. Once assembled, the first testing unit 20 defines a small distance between the connecting board 23 and the adjustable board 25.

When the adjustable board 25 is pushed toward the connecting board 23, the coil springs 26 are compressed, and the tapered heads 241 of the bolts 24 disengage from the tapered shoulders at the tapered portions 251a of the through holes 251. In this state, the adjustable board 25 is freely movable in directions traverse to the bolts 24, such that the positioning pins 27 and the probes 29 of the adjustable board 25 can move freely relative to the I/O ports of the rear side of the printed circuit board 80.

The second testing unit 60 comprises a pair of spaced actuators 61, a connecting board 63 attached between the actuators 61, and a plurality of connectors attached to the connecting board 63. The connectors are coupled to storage devices (not shown) such as hard disk drives and floppy disk drives, and are controlled by the control panel 18, for testing the I/O ports of the front side of the printed circuit board 80.

Referring back to FIGS. 1 and 2, in operation, a user at the control panel 18 starts the actuators 16. The shafts 161 of the actuators 16 are moved outwardly, and extend through the holes 141 of the side lower hooks 14. The shafts 161 push the side upper hooks 34 forwardly, and the upper hooks 34 rotate outwardly to begin disengaging from the lower hooks 14. The upper hooks 34 press the spring pins 321a inwardly toward the blocks 321 until the upper hooks 34 disengage from the lower hooks 14. At this time, the middle upper hook 34 contacts the second sensor 321b of the middle block 321. The second sensor 321b sends a signal to the control panel 18 indicating that the upper hooks 34 have disengaged from the lower hooks 14. Then the control panel 18 sends a signal to the master cylinders 40. Said medium is pumped into the cylinder casings 41, and the piston rods 43 extend and push the cover 30 open. The spring pins 321a rebound back against the upper hooks 34. When the piston rod 43 having the fourth sensor reaches said predetermined place, the third sensor 41a of the corresponding master cylinder 40 is activated by the fourth sensor of the piston rod 43. The third sensor 41a sends a signal to the control panel 18 indicating that the cover 30 is fully opened. The control panel 18 operates to stop pumping of said medium into the master cylinders 41, the piston rods 43 stop, and the cover 30 is maintained in the fully open position.

The printed circuit board assembly is placed on the top wall 12 of the base 10 for testing. Four corners of the reinforcing plate 90 are respectively supported on the inclined planes of the first positioning members 54. One of the second positioning members 55 of the lower unit 50 abuts against the printed circuit board 80 at the cutout 96 of the corresponding flange 94 of the reinforcing plate 90. The retractable block 552 of the other second positioning member 55 of the lower unit 21 resiliently urges the reinforcing plate 94. The bottom of the reinforcing plate 90 is supported by the protrusions 58 of the lower unit 50. The support posts 127 of the top wall 12 are aligned with the through holes 53 of the lower unit 50 and the openings 92 of the reinforcing member 90. Simultaneously, the position detector 56 of the lower unit 50 detects the reinforcing plate 90 is in the correct position.

Then the user at the control panel 18 sends a "close" signal to the master cylinders 40. The piston rods 43 retract back into the cylinder casings 41, and the cover 30 rotates down toward the base 10. The posts 323 contact the lower hooks 14 to support the cover 30, and the upper hooks 34 engage with the lower hooks 14. The horizontal parts of the upper hooks 34 are located under the horizontal parts of the lower hooks 14, and the middle upper hook 34 contacts the first sensor 14a of the middle lower hook 14. The first sensor 14a sends a signal to the control panel 18.

After receiving said signal of the first sensor 14a, the control panel 18 sends a signal to the actuators (not shown) of the upper unit 70. The actuators push the upper unit 70 downwardly toward the printed circuit board 80. The guiding shafts 72 of the upper unit 70 are inserted into the guiding holes 129a of the projections 129 of the top wall 12 respectively, to ensure accurate movement of the upper unit 70.

The upper unit 70 continues moving downwardly, and the head portions 752 of the positioning pins 75 extend through the positioning holes 82 of the printed circuit board 80, and make resilient contact with the reinforcing plate 90. The head portions 752 partly retract into the positioning pins 75 and contact the fifth sensors of the positioning pins 75. The fifth sensors send signals to the control panel 18, indicating the states of the positioning pins 75. The upper unit 70 continues moving downwardly, and the pressing posts 76 of the test plate 71 urge a top of the printed circuit board 80. The positioning pins 75 remain in contact with the reinforcing plate 90. The columns 74 of the test plate 71 subsequently contact respective opposite front and rear sides of the lower unit 50.

Figure 5:
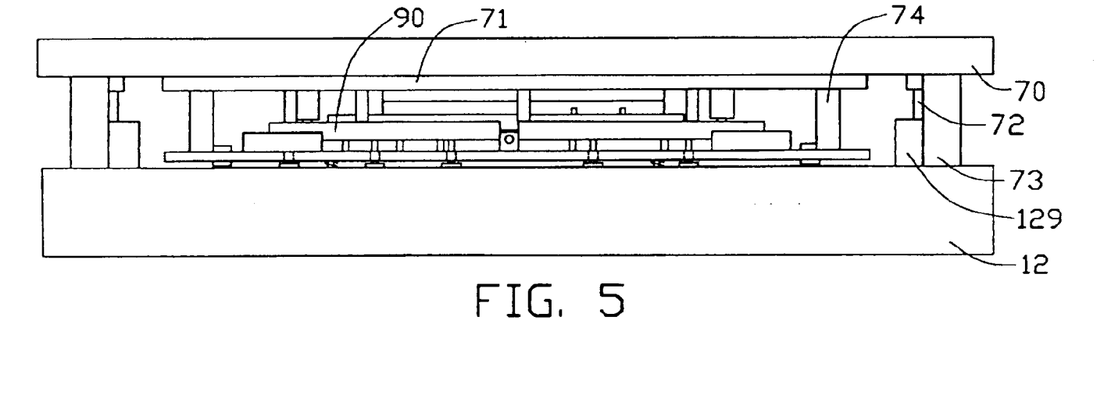
FIG. 5 is similar to FIG. 4, but showing the components fully assembled.

The upper unit 70 continues moving downwardly. The columns 74 of the test plate 71 drive the lower unit 50 to move downwardly along the shank portions 520 of the guiding studs 52. As a result, the support posts 127 extend through the through holes 53 of the lower unit 50 and the openings 92 of the reinforcing plate 90 to support a bottom of the printed circuit board 80. Then the actuators (not shown) of the upper unit 70 stop, the test card 78 is inserted into the socket 84 of the printed circuit board 80, and the pillars 73 of the upper unit 70 abut the top wall 12 to stop further movement of the upper unit 70.

At this position, the positioning pins 75 of the test plate 71 are extended through the positioning holes 82 of the printed circuit board 80, and the first positioning members 54 support the reinforcing plate 90 thereon. Thus, the printed circuit board 80 is prevented from moving relative to the holding fixture in directions that are parallel to the test plate 71. In addition, the printed circuit board 80 is sandwiched between the pressing posts 76 of the test plate 71 and the support posts 127 of the top wall 12. Thus, the printed circuit board 80 is prevented from moving relative to the holding fixture in directions that are perpendicular to the test plate 71.

The first and second testing units 20, 60 are then controlled by the control panel 18 to move toward the respective I/O ports at the rear and front sides of the printed circuit board 80. The printed circuit board 80 may not be accurately positioned relative to the adjustable board 25 of the first testing unit 20. In such case, the positioning pins 27 of the first testing unit 20 still make contact with respective I/O ports of the rear side of the printed circuit board 80. The adjustable board 25 is thereby pushed toward the connecting board 23 of the first testing unit 20, whereupon it can freely move in lateral directions. Thus the adjustable board 25 moves laterally until the positioning pins 27 are able to fully enter said respective I/O ports. At this point, the probes 29 are accurately aligned with respective I/O ports, whereupon the probes 29 fully enter said respective I/O ports. Simultaneously with the above operations involving the first testing unit 20, the connectors of the second testing unit 60 engage with the I/O ports of the front side of the printed circuit board 80.

Then, the control panel 18 sends test instructions to perform testing of the printed circuit board 80.

After the printed circuit board 80 is tested, the control panel 18 controls the first and second testing units 20, 60 in that order to move away and disengage from the I/O ports of the printed circuit board 80. The upper unit 70 moves upwardly away from the printed circuit board 80. Then, the cover 30 is opened. The user removes the printed circuit board 80 from the tester, which is then ready to test a next printed circuit board.

During opening and closing of the cover 30, the slave cylinders 45 act as springs. When the cover 30 is opened, the compressed gas in the cylinder casings of the slave cylinders 45 expands and extends the corresponding piston rods. This helps open the cover 30 quickly. When the cover 30 is closed, the gas is compressed once again so as to make the cover 30 close steadily. In alternative embodiments of the present invention, the first sensor 14a of the base 10 can be mounted on either of the two lower hooks 14 at opposite sides of the middle lower hook 14. The second sensor 321b of the cover 30 can be mounted on either of the two blocks 321 at opposite sides of the middle block 321. If desired, more than one first sensor 14a can be mounted on the base 10, and more than one second sensor 321b can be mounted on the cover 30. If the support posts 127 are removed from the top wall 12, the tester can be used for testing a printed circuit board 80 without the reinforcing plate 90.

While the present invention has been illustrated by the description of preferred embodiments thereof, and while the preferred embodiments have been described in considerable detail, it is not intended to restrict or in any way limit the scope of the appended claims to such detail. Additional advantages and modifications within the spirit and scope of the present invention will readily appear to those skilled in the art. Therefore, the present invention is not limited to the specific details and illustrative examples shown and described.

What is claimed is:

1. A tester for testing a printed circuit board assembly, the printed circuit board assembly comprising a printed circuit board and a reinforcing plate mounted below the printed circuit board, the printed circuit board comprising a plurality of input/output (I/O) ports mounted on front and rear sides thereof and a plurality of positioning holes defined therein, the reinforcing plate defining a plurality of openings therein, the tester comprising:
   a base comprising a top wall and a control panel, a plurality of support posts formed on the top wall;
   a cover pivotally attached to the base;
   a pair of master cylinders pivotally attached to the base and the cover respectively, and controlled by the control panel to open and close the cover;
   a fixture comprising an upper unit and a lower unit, the upper unit movably received in the cover, the lower unit adjustably supported on the top wall, the lower unit comprising means for positioning the reinforcing plate thereon, and a plurality of through holes defined therein aligned with the openings of the reinforcing plate for extension of the support posts to support the printed circuit board, the upper unit comprising a plurality of positioning pins depending therefrom for engaging in the positioning holes of the printed circuit board, and a plurality of pressing posts formed thereon for pressing the printed circuit board; and
   at least one testing unit controlled by the control panel for testing the I/O ports of the printed circuit board.

2. The tester as claimed in claim 1, wherein a plurality of spaced first hooks is arranged on the top wall, and a first sensor is mounted on a middlemost one of the first hooks.

3. The tester as claimed in claim 2, wherein a hole is defined in each of side first hooks located at opposite sides of the middlemost first hook, a pair of actuators is arranged behind the side first hooks, and each of the actuators comprises a slidable shaft extending through a corresponding hole.

4. The tester as claimed in claim 2, wherein a beam is arranged at a front of the cover, and a plurality of second hooks is pivotally attached to the beam for engaging with the first hooks respectively.

5. The tester as claimed in claim 4, wherein a plurality of blocks is upwardly arranged on the beam corresponding to the second hooks, the blocks are positioned behind the second hooks respectively, a second sensor is arranged on a middlemost one of the blocks, and a plurality of spring pins is connected between the blocks and the second hooks respectively.

6. The tester as claimed in claim 1, wherein each of the master cylinders is attached to lateral sides of the tester respectively, each of the master cylinders comprises a cylinder casing and a piston rod, and a third sensor is mounted on an outer surface of the cylinder casing.

7. The tester as claimed in claim 1, further comprising a pair of slave cylinders connecting the cover with the base.

8. The tester as claimed in claim 1, wherein the positioning means comprises a plurality of first positioning members formed at each of corners of the lower unit for supporting four corners of the reinforcing plate, and a plurality of protrusions formed on the lower unit for supporting a bottom of the reinforcing plate.

9. The tester as claimed in claim 8, wherein the positioning means further comprises a pair of second positioning members at opposite sides of the lower unit for urging opposite sides of the printed circuit board assembly, and one of the second positioning members comprises a retractable block resiliently urging a corresponding side of the printed circuit board assembly.

10. The tester as claimed in claim 8, wherein a position detector is mounted on the lower unit for detecting whether the printed circuit board assembly is disposed in a correct position.

11. The tester as claimed in claim 1, wherein a plurality of spring pins is formed on the top wall of the base for resiliently supporting the lower unit thereon.

12. The tester as claimed in claim 11, wherein corners of the lower unit comprise a plurality of guiding studs each having a shank portion, and the top wall defines a plurality of holes receiving the shank portions of the guiding studs respectively.

13. The tester as claimed in claim 1, wherein each of the positioning pins comprises a spring loaded head portion for extending through a corresponding positioning hole of the printed circuit board, and a sensor mounted in the positioning pins for sending a signal to the control panel when the head portion contacts the reinforcing plate.

14. The tester as claimed in claim 1, wherein a plurality of actuators attaches the upper unit to the cover, the actuators being controlled by the control panel to move the upper unit.

15. The tester as claimed in claim 1, wherein the at least one testing unit comprises at least one actuator, a connecting board attached to the at least one actuator, and an adjustable board adjustably attached to the connecting board, and wherein the connecting board defines a plurality of stepped holes therein, the adjustable board defines a plurality of through holes corresponding to the stepped holes of the connecting board, each of the through holes comprises a tapered portion and a shouldered portion, the springs are received between the stepped holes and the shouldered portions of the through holes respectively, each of the bolts comprises a tapered head, the bolts extend through the through holes of the adjustable board and the springs and are fixedly engaged in the stepped holes of the connecting board respectively, and the tapered heads of the bolts engage in the tapered portions of the adjustable board respectively.

16. A tester for testing a printed circuit board, comprising:
a base comprising a top wall and a control panel adapted to receive and send signals, at least one first hook provided on the top wall, a first sensor arranged at the at least one first hook for sending signals to the control panel, at least one actuator arranged adjacent the at least one first hook;
a cover pivotally attached to the base, at least one second hook being provided on the cover and engaging with the at least one first hook of the base, the at least one actuator of the base disengaging the at least one second hook from the at least one first second hook, a second sensor being arranged on the cover for sending signals to the control panel;
a fixture comprising an upper unit movably received in the cover and a lower unit resiliently supported on the top wall, a plurality of first positioning members formed at corners of the lower unit for supporting four corners of the printed circuit board, a plurality of pressing post depending from the upper unit for pressing the printed circuit board; and
at least one testing unit for testing the printed circuit board.

17. The tester as claimed in claim 16, wherein a plurality of protrusions is formed on the lower unit for supporting the printed circuit board, and a plurality of positioning pins depends from the upper unit for insertion into positioning holes of the printed circuit board.

18. A tester assembly comprising:
a base with a plurality of support posts upwardly extending therefrom;
a cover moveably attached upon the base;
a lower unit supportably resiliently vertically moveably positioned upon the base;
a plurality of first through holes defined in the lower unit;
an upper unit attached to an underside of the cover toward the base;
a plurality of pressing posts downwardly extending from an underside of the upper unit;
a tested printed circuit board located between the upper unit and the lower unit and equipped with an associated reinforcement plate intimately attached to an underside thereof, said test printed circuit board and the associated reinforcement plate being immovably laterally restrained by said lower unit; and
a plurality of second through holes defined in the reinforcement plate in alignment with the corresponding first through holes, respectively;
wherein
when the cover and the base is assembled together, the support posts upwardly extend through the corresponding first and second through holes to abut against the underside of the printed circuit board, and the pressing posts downwardly extend to abut against an upper side of the printed circuit board, so that the printed circuit board is vertically fixedly retained in position for testing.

* * * * *